United States Patent [19]

Canfield et al.

[11] Patent Number: 5,159,292
[45] Date of Patent: Oct. 27, 1992

[54] ADAPTIVE PHASE LOCKED LOOP

[75] Inventors: Barth A. Canfield; Mark F. Rumreich, both of Indianapolis, Ind.; Heinrich Schemmann, Villingen, Fed. Rep. of Germany

[73] Assignee: Thomson Consumer Electronics, Inc., Indianapolis, Ind.

[21] Appl. No.: 841,115

[22] Filed: Feb. 25, 1992

[51] Int. Cl.$^5$ ............................ H03L 7/08; H03L 7/10
[52] U.S. Cl. ........................................ 331/1 A; 331/14; 331/17; 331/20; 331/DIG. 2; 358/158
[58] Field of Search ................. 331/1 A, 4, 10, 11, 331/14, 17, 18, 20, 25, DIG. 2; 358/19, 158

[56] References Cited

U.S. PATENT DOCUMENTS 4,491,862 1/1985 Flamm ........................ 358/21 R
4,884,040 11/1989 Fling ........................... 331/1 A

OTHER PUBLICATIONS

Floyd Martin Gardner, "Phaselock Techniques", 1979, Wiley & Son, pp. 65, 72, 79, 82–89.

*Primary Examiner*—David Mis
*Attorney, Agent, or Firm*—Joseph S. Tripoli; Eric P. Herrmann; Ronald H. Kurdyla

[57] ABSTRACT

A PLL system having a variable oscillator and apparatus for generating both phase and frequency error signals for controlling the variable oscillator, includes apparatus, responsive to the polarity of the frequency error signal, to selectively disconnect the frequency error signal from the variable oscillator when the PLL system approaches phase lock.

10 Claims, 3 Drawing Sheets

ADAPTIVE PHASE LOCKED LOOP

This invention relates to Phase Locked Loops (PLL's), and more particularyly to apparatus for controlling error signals applied in the feedback loops thereof.

BACKGROUND OF THE INVENTION

Phase Locked Loops are circuits well known in the communications arts, for synchronizing a variable local oscillator with the phase and/or frequency of a component of a transmitted signal. Typically such circuitry includes a phase detector which is responsive to the transmitted signal and the output of the local oscillator, to generate a phase error signal proportional to the difference in those between a component of the transmitted signal and the oscillator output. The phase error signal is coupled to control the oscillation rate of the variable oscillator. In order to enhance the operation the PLL, some systems include a second loop which generates an error signal proportional to the difference between the frequency of the variable oscillator and the frequency of the component of the transmitted signal. The frequency error signal is added to the phase error signal for controlling the rate of the oscillator. Nominally the variable oscillator will achieve the desired frequency before phase lock is achieved, at which time the frequency error signal is substantially zero, and the PLL is controlled by only the phase error signal. That is, near phase lock the frequency error signal is, for the most part, inherently disconnected.

It has been suggested, that in certain PLL systems it may be desirable to actively disconnect the frequency error signal when phase lock is approached. Actively disconnecting the frequency error term will preclude noise in the frequency error signal from causing jitter in the phase of the signal provided by the variable oscillator. Phase jitter is particularly problematic in PLL's including frequency error circuitry arranged to respond to digitized signals, for example PLL's responsive to the pulse code modulated (PCM) representation of the subcarrier burst of a composite video signal. U.S. Pat. No. 4,884,040, issued to R. T. Fling (which is incorporated in its entirety herein by reference) exemplifies such a PLL. The present inventors have found that the performance of a Fling type PLL may be significantly improved by actively disconnecting the frequency error term when the system approaches phase lock.

Detecting phase lock in analog PLL systems is typically accomplished by mixing the component of the transmitted signal with the output from the variable oscillator shifted by 90 degrees and low pass filtering the result. This process is not easily emulated with digital circuitry for operation on PCM samples however, because the realization of digital mixers (i.e. multipliers) requires hundreds of transistors.

SUMMARY OF THE INVENTION

The present invention is a PLL system including a variable oscillator and apparatus for generating both phase and frequency error signals for controlling the variable oscillator. Further apparatus, accumulates samples of a signal component to which the system is to be phase locked, and responsive to the polarity of these accumulated samples, selectively disconnects the frequency error signal from the variable oscillator when the PLL system approaches phase lock.

DETAILED DESCRIPTION

Figure 1:
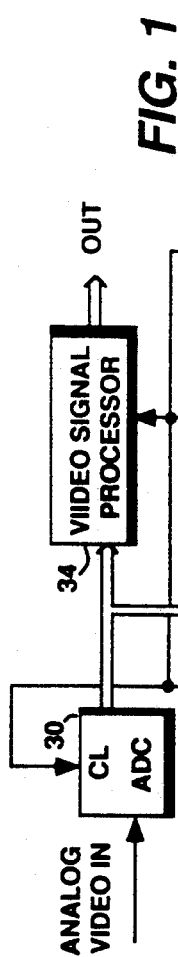
FIG. 1 is a block diagram of a system environment in which the invention may be utilized.

The invention will be described in the environment of an NTSC video signal processing system, though it will be readily apparent that it may be implemented in practically any PLL system utilizing both phase and frequency error signals. Referring to FIG. 1, an analog video signal from, for example a television tuner, is applied to an analog-to-digital converter (ADC) 30. A digitized version of the analog signal is coupled from the output of the ADC to a horizontal synchronizing signal separator 31, a video signal processor 34, and a phase detector 32. The video signal processor 34 conditions the video signal for display or storage. The separator 31 produces horizontal synchronizing pulses, which are coupled to the phase detector, to condition the phase detector to operate in a phase measuring mode during the chrominance reference burst intervals. The phase detector 32 is responsive to the digitized video signal to generate a signal for controlling the relative phase of a voltage controlled oscillator (VCO) 35. Finally the VCO 35 generates a master clock signal for operating the other circuit elements. In particular the timing of the pulses of the master clock signal determine the instances at which the ADC 30 develops digital samples of the analog input signal.

Figure 2:
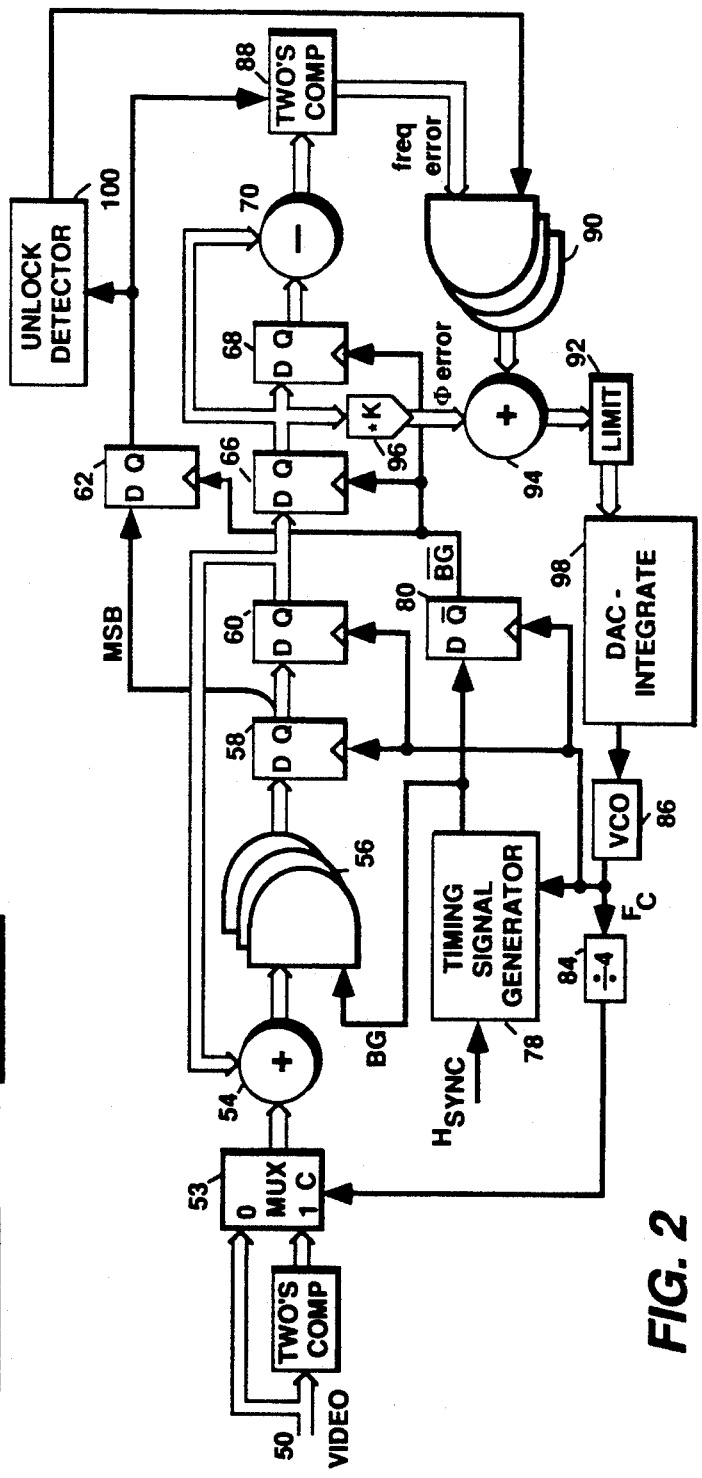
FIG. 2 is a schematic diagram of a phase locked loop embodying the invention.

FIG. 2 illustrates a digital embodiment of the phase detector, included within a PLL which is generalized version of the PLL described in U.S. Pat. No. 4,884,040. Briefly, a phase error signal, provided by a scaler 96, and frequency error signal provided by a two's complement circuit 88, are combined in an adder 94, and used to control a voltage controlled oscillator (VCO) 86. The frequency error signal is selectively applied to the adder 94 via a gate circuit 90, which is controlled by an unlock detector 100. That is, when the system is near frequency lock, the gate 90 inhibits passage of the frequency error signal. The VCO 86 generates a master clock signal $F_c$ which is used to operate the overall system, and which, in this example, has a frequency of four times the color subcarrier frequency.

In FIG. 2, horizontal synchronizing signals, $H_{SYNCI}$ from the conventional horizontal synchronizing signal separator 31 are coupled to a timing signal generator 78, and digital video samples from the analog-to-digital convertor 30, are coupled to bus 50. The timing signal generator 78, responsive to the clocking signal $F_c$ and the horizontal synchronizing pulses, generates a burst gate signal BG. The burst gate signal nominally provides a pulse encompassing an integral number of cycles of the subcarrier burst component of each active horizontal line of composite video signal. The burst gate signal may be generated by conventional counting circuits responsive to the master clock signal $F_c$ and the horizontal synchronizing signals.

The digital video signal on bus 50 is coupled to a complementing circuit 52 and one input port of a multiplexer 53. The output port of the complementing circuit is coupled to a second input port of the multiplexer 53. The multiplexer 53 is conditioned by a square wave clock signal of subcarrier frequency to alternately couple two successive samples from bus 50 to its output port and then two successive samples from the complementing circuit 52 to its output port. The clock signal applied to multiplexer 53 is generated by dividing the master clock signal $F_c$ from the VCO 86, by four in divider 84. The sample stream output by multiplexer 53, during the burst interval, represents a substantially rectified version of the burst signal, when the system is phase locked. Alternate samples provided by the multiplexer 53 represent samples of quadrature related signals corresponding to, for example, the R-Y and B-Y or the I and Q color difference video signal components.

The samples provided by the multiplexer 53 are coupled to one input port of an adder 54 which is coupled in cascade with one-sample-period storage elements 58 and 60 via the bank of AND gates 56. The output port of storage element 60 is coupled to a second input port of adder 54. The combination of Adder 54 and storage elements 58 and 60 forms a compound accumulator. The accumulator is active when the bank of AND gates is conditioned by the burst gate signal BG to couple the adder 54 to the storage element 58. Alternatively, when the burst gate signal is low, the bank of AND gates provide a zero output signal which effectively zeroes the accumulator. As such the accumulator successively sums samples of the burst signal from single line intervals. During the time that the accumulator is active sums of samples representing the respective quadrature signals are maintained distinct in the two storage elements 58 and 60. At the termination of the burst interval, the R-Y and B-Y accumulated sums are resident in storage elements 60 and 58 respectively (at least when the system has attained phase lock).

The sign bit conductor of the output port of the storage element 58 is coupled to the data (D) input of a one bit D-type latch 62. The sign bit is representative of the polarity of the accumulated sample provided by the latch 58.

The output port of the storage element 60 is coupled to the data input port of a parallel-bit D-type latch 66. A second parallel-bit D-type latch 68 is coupled in cascade with latch 66. The burst gate signal is coupled to the data input port of a further D-type latch 80 which provides an inverted version of the burst gate signal at its $\overline{Q}$ output terminal. The inverted burst gate signal from latch 80 is coupled to the clock input terminals of latches 62, 66 and 68 and conditions latches 62 and 66 to store the sign bit and the accumulated value respectively, from latches 58 and 60 occurring at the termination of the burst interval. The values in latches 62 and 66 are stored for the duration of a line interval. The values in latch 66 are transferred to latch 68 at successive line intervals. Latches 66 and 68 store the accumulate R-Y samples from two successive video lines and latch 62 stores the sign bit of the accumulated B-Y samples from respective successive video lines.

At phase lock the values at the output of the latch 66 should be zero valued. Any differences from zero are proportional to the degree by which the system is out of phase lock. Hence the output of the latch 66 may be used as a phase error signal. The output of the latch 66 is coupled to a scaling circuit 96 to magnify the phase error signal and enhance the phase error sensitivity. The magnified phase error signal is then coupled to one input of the adder 94.

The output ports of latches 66 and 68 are coupled respectively to the minuend and subtrahend input ports of a subtracter 70 which produces the difference of the accumulated R-Y values from successive video lines. The assumption is made that the signal applied to port 50 are taken synchronously with the clock signal $F_c$, and that over respective burst intervals the clock frequency is relatively constant. The accumulated values provided by the latches 66 and 68 are related to the phase difference between the burst signal and the clock signal $F_c$. The differences provided by the subtracter 70 approximate the phase differential from line to line (albeit with a possible polarity error), and thus is a measure of the frequency difference between the burst component and the sampling clock.

The differences provided by the subtracter 70 are coupled to a complementing circuit 88. The complementing circuit 88 is controlled by the sign bit provided by the latch 62 to correc the polarity of the frequency error signal. The output of the complementing circuit is coupled to a gating circuit 90, which is controlled by the detector 100 to pass the frequency error signal to the adder 94 when the loop is not frequency locked, and to apply a zero value to the adder otherwise. The phase and frequency error signals are added by the adder 94 and applied to a limiter 92. The limiter 92 constrains the combined error signal to values equal to or less than a predetermined limit. The limited error signal is low pass filtered, converted to analog form, and applied to the VCO 86. Note, the frequency error term is derived from the R-Y accumulated values provided by the latch 60, but it may also be derived from the B-Y accumulated values provided by the latch 58. In this latter case the accumulated values occurring near phase lock will be larger and the frequency error term will be less susceptible to errors due to signal noise.

Nominally, when the system acquires frequency lock the differences provided by the subtracter 70 should be zero valued, and thus the frequency error term should be zero. However due to noise and or quantization effects, the frequency error may include a residual value which tends to adversely affect phase locking. Thus it is advantageous to inhibit (i.e. gate) the frequency error term to the adder 94 after frequency lock is attained.

Considering "unlock" detection, the inventors have determined that the sign-bit or polarity of the accumulated samples for respective lines changes a significant number of times during a field interval, when the system is not frequency locked. Alternatively, the sign-bit of the accumulated samples does not change when the system is frequency locked. Therefore, it is possible to determine the frequency unlock condition by merely counting the number of times the accumulated samples change polarity during an interval and comparing this count value to a threshold value.

The polarity of the accumulated samples from either latch 58 or latch 60 may be monitored. However, in the embodiment of FIG. 2, it will be recalled that the values in latch 60 tend toward zero as the system approaches the lock condition, and will exhibit a rather low signal to noise ratio. Thus it is preferred to monitor the polarity of the accumulated samples provided by the latch 58. Assuming the samples being processed are in binary form including a sign-bit in the most significant bit position (MSB), and value bits in the lesser bit positions (LSB's), the polarity of the accumulated samples may be monitored by simply monitoring the sign-bit or MSB of the accumulated samples. The MSB of the accumulated samples is available in latch 62 of FIG. 2.

Figure 3:
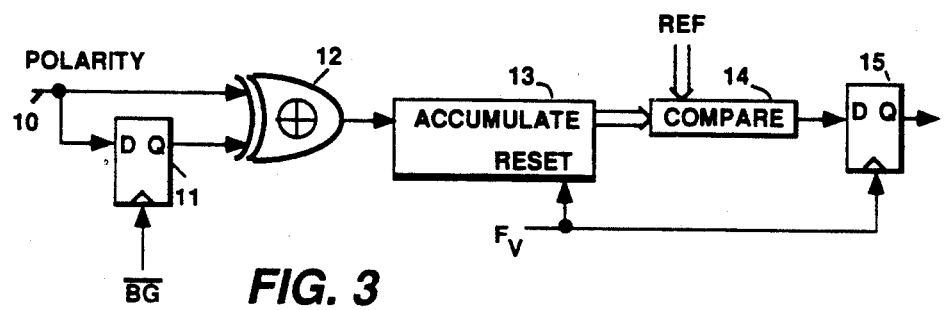
FIGS. 3 and 4 are block diagrams of frequency lock detectors which may be utilized for element 100 of FIG. 2.

FIG. 3 illustrates one embodiment of an unlock detector which may be implemented for detector 100. In FIG. 3, the MSB's from latch 62 are coupled to one input terminal of an exclusive OR circuit (XOR) 12, and to the data input of a latch 11. The output of latch 11, representing the MSB's delayed by one line internal, is coupled to a second input terminal of the XOR 12. XOR 12 produces logic "1" and "0" values when the signals at its two input terminals are different and the same respectively. As such if there is a polarity change in the accumulated samples between successive lines, XOR 12 will provide a logic 1 value. The output of the XOR 12 is coupled to element 13 wherein the logic 1 values are accumulated or counted over an interval of time, which in this example corresponds to a video field interval. The total number of logic 1 values over this interval are compared to a reference or threshold value in the comparator 14. If the number of logic 1 values exceeds the reference value, the comparator 14 outputs a logic 1 value which logic 1 value is stored in the latch 15 for the duration of the next field interval. The output of the latch 15 is applied as the control signal to the gate circuit 90.

The latch 15 is conditioned by a vertical pulse signal $F_v$ to store the output values provided by the comparator. The signal $F_v$ may be provided by a conventional vertical sync separator. In addition to controlling the latch 15, the signal $F_v$ is applied to the element 13 to reset the count value therein to zero at the end of each field interval.

Figure 3A:
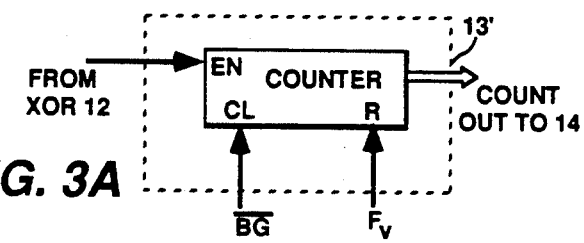
FIG. 3A is a block diagram of apparatus which may be used to implement element 13 of FIG. 3.

FIG. 3A illustrates one example of apparatus for generating the count of the logic 1 values provided by the XOR 12. In FIG. 3A, the element 13' is realized with a simple binary counter. The output values from the XOR 12 are applied to an enable input of the counter, and the signal $\overline{BG}$ is applied to the clock input of the counter. The counter is enabled to count pulses of the signal $\overline{BG}$ for each occurrence of a logic 1 provided by the XOR 12. The vertical signal $F_v$ is applied to a reset input of the counter to reset the counter to zero once each field interval.

Figure 4:
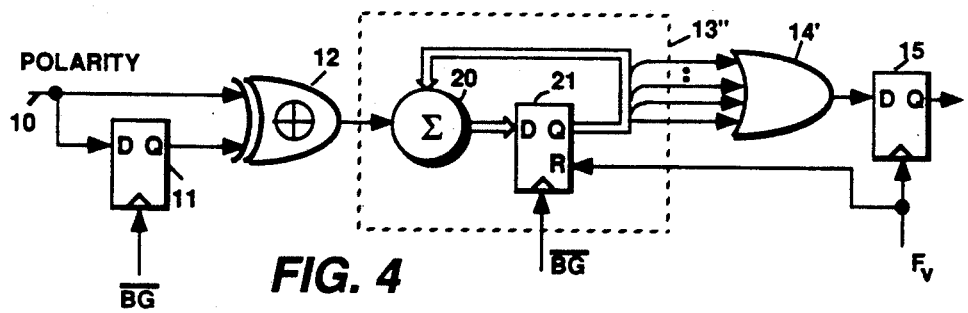

FIG. 4 shows a further embodiment wherein the logic 1 values provided by XOR 12 are added via an accumulator consisting of the adder 20 and latch 21. Latch 21 is clocked at line rate to condition the accumulator to add the zero or one values provided by the XOR 12, to the accumulated sum of all previous one and zero values occurring during the field interval. Once per field interval the latch 21 is reset to a zero value by application of a signal $F_v$ having one pulse per field interval. In FIG. 4, the comparison function is provided by an OR gate 14'. In this instance the more significant bit connections of the output of the latch 21 are coupled to respective input terminals of the OR gate 14'. The output of the OR gate 14' will be a logic 1 value if any one of these more significant bit connections exhibits a logic 1 value. Consider that the latch 21 has N bit lines to represent the count value, and that all except M of these N bit lines are coupled to respective input terminals of the OR gate 14'. The OR gate 14' will output a logic 1 value for all count values exceeding $(2^M - 1)$.

Figure 5:
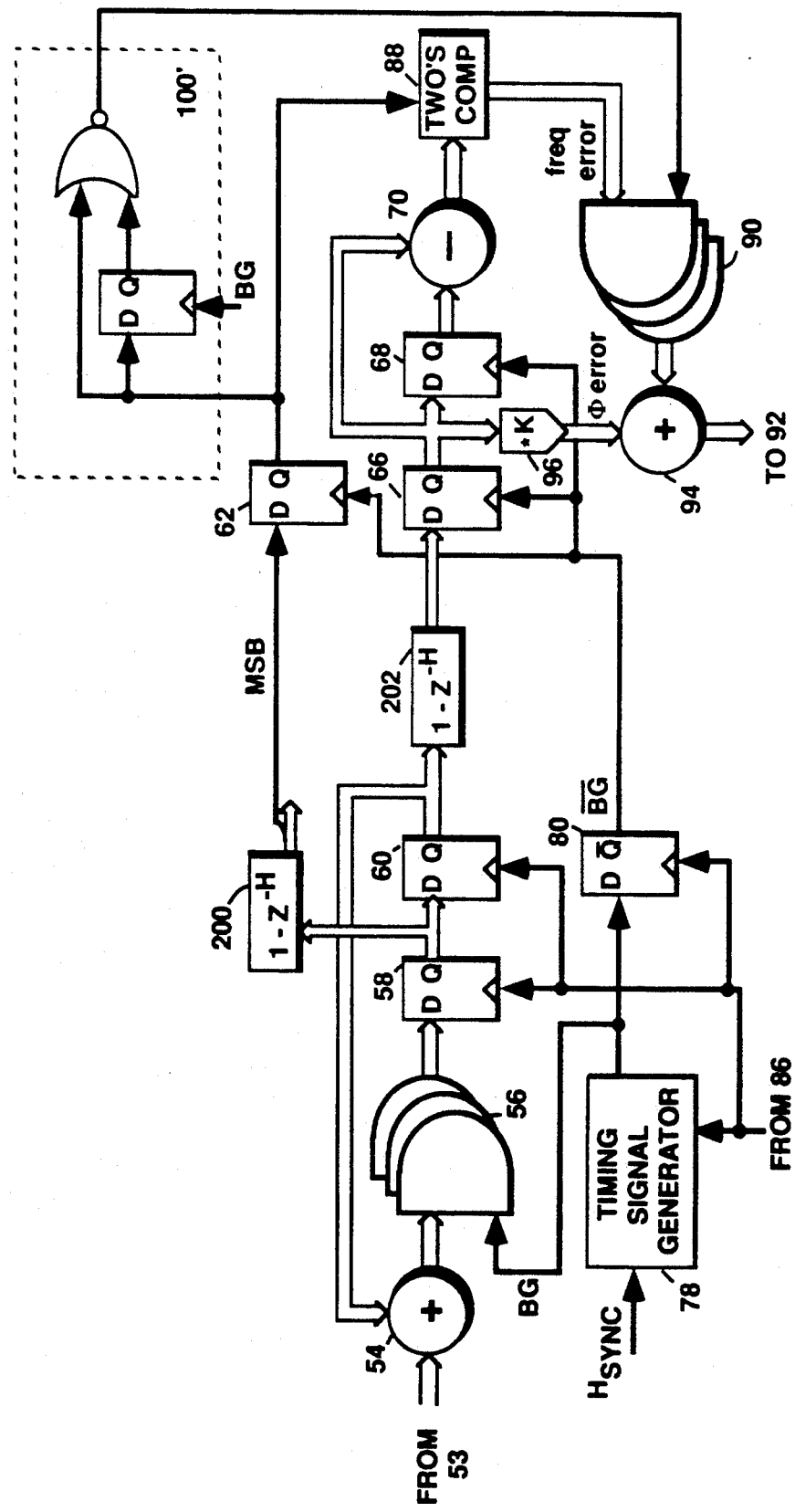
FIG. 5 is a block diagram of additional apparatus applied in the FIG. 2 circuitry for conditioning the FIG. 2 circuitry to be operable with PAL video signals.

Similar circuitry may be used in PLL systems operating on PAL video signals. Pal signals include a burst component in which one of the quadrature phase components of burst changes phase 90 degrees from line to line. To accommodate this phase shift in the phase-frequency detection circuitry, accumulated values from adjacent lines are averaged or summed. This causes the swinging phase of the PAL burst signal to appear similar to the burst of NTSC signals. The additional circuitry necessary to operate on PAL signals is illustrated in FIG. 5. In FIG. 5 a first filter 202, having a transfer function $H(z) = 1 + z^{-H}$ is interposed between the latches 60 and 66, and a second filter 200, having a similar transfer function, is coupled to the output of latch 58. Both value and polarity bits are applied to the filter 200. From latch 58, however only the polarity bit provided by the filter 200 is coupled to the latch 62. In the transfer function, "z" is the conventional Zee transform variable and the exponent "H" indicates a sample delay interval of one line period. The remainder of the circuitry is unchanged.

The exclusive OR gate of FIGS. 3 or 4 may be replaced with a NOR gate. If and only if both inputs to the NOR gate are of positive polarity the system is presumed to be out of lock and the frequency term is added to the phase term. There is a disadvantage to this detector in that the benefit of the frequency error term is realized only about 50 percent of the time.

The above described PLL systems may be applied to other than video signals. In such application the accumulator consisting of adder 54, gate 56 and latches 58, 60 may be conditioned to continuously accumulate sample values or to selectively reset at predetermined intervals. The latches 62, 66 and 68 will be clocked at a regular rate. In addition latch 11 will be clocked at a similar regular rate, and the accumulator 13 is to be reset at predetermined intervals.

What is claimed is:

1. A phase locked loop for generating an oscillatory signal phase locked to a component of a further signal comprising:
   a variable oscillator for generating said oscillatory signal;
   a source of said further signal;
   means for sampling said further signal at instants determined by said oscillatory signal, to provide samples of said further signal,;
   means, responsive to said samples, for generating phase error signals and frequency error signals for controlling the rate of said variable oscillator; and
   means responsive to the polarity of ones of said samples for inhibiting said frequency error signals from controlling said variable oscillator when said oscillatory signal attains a predetermined frequency relationship with said component of said further signal.

2. The phase locked loop set forth in claim 1 wherein;
   said samples are multibit samples including value bits and a polarity bit;
   said means for generating phase and frequency error signals includes means for generating accumulated values of said samples; and
   said means, responsive to the polarity of ones of said samples for inhibiting said frequency error signals, includes a gating means conditioned by the polarity bit of said accumulated samples, to pass or not pass said frequency error signal to said variable oscillator.

3. The phase locked loop set forth in claim 2 wherein said means responsive to the polarity of ones of said samples for inhibiting said frequency error signals, further includes;

means for comparing the polarity bits of said accumulated samples generated at predetermined intervals, and generating logic values of first and second states for the polarity bits of the compared polarity bits being equal or not equal respectively.

4. The phase locked loop set forth in claim 3 wherein said means responsive to the polarity of ones of said samples for inhibiting said frequency error signals, further includes;

means for counting the number of occurrences of one of said first and second states over a further predetermined interval to generate a count value; and means for generating a signal to condition said gating means to pass said frequency error signal when said count value exceeds a predetermined value.

5. The phase locked loop set forth in claim 3 wherein said means for comparing the polarity bits of said accumulated samples generated at predetermined intervals, comprises:

delay means, having an input terminal coupled for receiving the polarity bit of said accumulated samples, and an output terminal for providing the polarity bit of said accumulated samples delayed by said predetermined interval; and an exclusive OR circuit having first and second input terminals coupled to the input and output terminals of said delay means.

6. The phase locked loop set forth in claim 3 wherein said means for comparing the polarity bits of said accumulated samples generated at predetermined intervals, comprises:

delay means, having an input terminal coupled for receiving the polarity bit of said accumulated samples, and an output terminal for providing the polarity bit of said accumulated samples delayed by said predetermined interval; and a NOR circuit having first and second input terminals coupled to the input and output terminals of said delay means.

7. Improved phase control circuitry of the type including means for accumulating sample values for generating phase error signals and frequency error signals for controlling the phase of a further signal, said samples including a polarity indication and respective values, and wherein the phase and frequency error signals are combined to develop a composite control signal, the improvement comprising:

means responsive to the polarity indication of accumulated samples for generating a control signal having first and second states when said polarity indication changes state more or less than a predetermined number of times respectivetly in a predetermined interval; and means responsive to said control signal for inhibiting the combining of the frequency error signal with the phase error signal when said control signal exhibits said second state.

8. The circuitry set forth in claim 7 wherein said means for generating a control signal comprises means for comparing the polarity bits of said accumulated samples generated at predetermined intervals, and providing logic one values when compared polarity bits indicate a polarity difference.

9. The circuitry set forth in claim 8 wherein said means for generating a control signal further includes;

means for counting the number of occurrences of said logic one values over a further predetermined interval to generate a count value; and means for conditioning said control signal to exhibit said second state when said count value exceeds a predetermined value.

10. The circuitry set forth in claim 7, wherein said accumulated sample values correspond to samples of a burst reference signal from respective lines of a video signal, and wherein said means responsive to the polarity indication of accumulated samples for generating a control signal further includes means for averaging accumulated samples from successive lines af said video signal to generate averaged accumulated samples, and thereafter generating said control signal having first and second states when the polarity indication of the averaged accumulated samples changes state more or less than a predetermined number of times respectively in a predetermined interval.

* * * * *